(12) United States Patent
Saly

(10) Patent No.: US 10,096,464 B2
(45) Date of Patent: Oct. 9, 2018

(54) ATOMIC LAYER DEPOSITION OF HIGH DENSITY SILICON DIOXIDE

(71) Applicant: Applied Materials, Inc., Santa Clara, CA (US)

(72) Inventor: Mark Saly, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/873,313

(22) Filed: Oct. 2, 2015

(65) Prior Publication Data

US 2016/0099144 A1 Apr. 7, 2016

Related U.S. Application Data

(60) Provisional application No. 62/059,851, filed on Oct. 4, 2014.

(51) Int. Cl.
| | |
|---|---|
| *H01L 21/02* | (2006.01) |
| *C23C 16/40* | (2006.01) |
| *C23C 16/452* | (2006.01) |
| *C23C 16/455* | (2006.01) |

(52) U.S. Cl.
CPC ...... *H01L 21/02164* (2013.01); *C23C 16/402* (2013.01); *C23C 16/452* (2013.01); *C23C 16/45536* (2013.01); *C23C 16/45551* (2013.01); *H01L 21/0228* (2013.01); *H01L 21/02274* (2013.01)

(58) Field of Classification Search
CPC ......... H01L 21/02164; H01L 21/02274; H01L 21/0228; C23C 16/45536; C23C 16/452; C23C 16/45551; C23C 16/402
See application file for complete search history.

(56) References Cited

U.S. PATENT DOCUMENTS

| | | | |
|---|---|---|---|
| 6,335,288 B1 | 1/2002 | Kwan et al. | |
| 6,346,302 B2 | 2/2002 | Kishimoto et al. | |
| 6,802,944 B2 | 10/2004 | Ahmad et al. | |
| 6,808,748 B2 | 10/2004 | Kapoor et al. | |
| 7,122,488 B2 | 10/2006 | Joshi et al. | |
| 7,524,750 B2 | 4/2009 | Nemani et al. | |
| 8,414,747 B2 | 4/2013 | Qi et al. | |
| 2001/0048980 A1 | 12/2001 | Kishimoto et al. | |
| 2005/0215066 A1 | 9/2005 | Joshi et al. | |
| 2006/0286776 A1* | 12/2006 | Ranish | C23C 16/0227 438/478 |
| 2011/0256726 A1* | 10/2011 | LaVoie | C23C 16/045 438/702 |
| 2013/0210238 A1* | 8/2013 | Yudovsky | H01L 21/02104 438/758 |
| 2016/0020092 A1* | 1/2016 | Kang | H01L 21/02274 438/761 |

* cited by examiner

*Primary Examiner* — Jay C Chang
*Assistant Examiner* — Charles R Peters
(74) *Attorney, Agent, or Firm* — Servilla Whitney LLC

(57) ABSTRACT

Atomic layer deposition methods for the low temperature deposition of silicon dioxide films having low nitrogen content and low wet etch rates. Silicon dioxide films are deposited and treated with plasma and re-oxidized resulting in low nitrogen content films.

6 Claims, 7 Drawing Sheets

ATOMIC LAYER DEPOSITION OF HIGH DENSITY SILICON DIOXIDE

CROSS-REFERENCE TO RELATED APPLICATIONS

This application claims priority to U.S. Provisional Application No. 62/059,851, filed Oct. 4, 2014, the entire disclosure of which is hereby incorporated by reference herein.

TECHNICAL FIELD

Embodiments of the present disclosure generally relate to methods of depositing a silicon oxide film. More particularly, the disclosure relates to a deposition process for forming a silicon oxide film with low nitrogen content.

BACKGROUND

The semiconductor industry's tolerance for process variability continues to decrease as the size of semiconductor devices shrink. To meet these tighter process requirements, the industry has developed a host of new processes which meet the tighter process window requirements, but these processes often take a longer time to complete. For example, for forming a copper diffusion barrier layer conformally onto the surface of a high aspect ratio, 65 nm or smaller interconnect feature, it may be necessary to use an ALD process. ALD is a variant of CVD that demonstrates superior step coverage compared to CVD. ALD is based upon atomic layer epitaxy (ALE) that was originally employed to fabricate electroluminescent displays. ALD employs chemisorption to deposit a saturated monolayer of reactive precursor molecules on a substrate surface. This is achieved by cyclically alternating the pulsing of appropriate reactive precursors into a deposition chamber. Each injection of a reactive precursor is typically separated by an inert gas purge to provide a new atomic layer to previous deposited layers to form a uniform material layer on the surface of a substrate. Cycles of reactive precursor and inert purge gases are repeated to form the material layer to a desired thickness. The biggest drawback with ALD techniques is that the deposition rate is much lower than typical CVD techniques by at least an order of magnitude. For example, some ALD processes can require a chamber processing time from about 10 to about 200 minutes to deposit a high quality layer on the surface of the substrate.

Silicon dioxide is a very important material in the microelectronics industry. With the continuation of device miniaturization and increase in the complexity of the device architecture, it becomes very challenging to deposit highly conformal films over these structures. In particular, 3D NAND manufacturing will need highly conformal silicon dioxide and silicon nitride deposition inside of holes that have very high aspect ratios. The films need to be similar quality to high temperature process (>600 C) with a wet etch rate (WER) of about 1 and low leakage. Many of the future applications in the microelectronics industry require the deposition of high quality silicon dioxide films at low to mid-range temperatures. Accordingly, there is an ongoing need in the art for methods of uniformly depositing a high quality silicon film on a substrate in an efficient and cost effective manner.

SUMMARY

Embodiments of the disclosure are directed to processing methods. A silicon oxide film is deposited on a substrate surface. The silicon oxide film is exposed to a plasma to form a plasma treated silicon oxide film. The plasma treated silicon oxide film is exposed to an oxidant to decrease nitrogen content in the plasma treated silicon oxide film to form a low nitrogen content silicon oxide film.

Additional embodiments of the disclosure are directed to processing methods. A silicon oxide film is deposited on a substrate surface by sequential exposure of the substrate surface to a silicon precursor followed by a reactant comprising one or more of oxygen, ozone, water, nitric acid, oxygen plasma or peroxide. The silicon oxide film has a hydrogen content. The silicon oxide film is exposed to a plasma comprising one or more of hydrogen, nitrogen, argon or nitric oxide to form a plasma treated silicon oxide film with a nitrogen content and a lower hydrogen content than the silicon oxide film. The plasma treated silicon oxide film is exposed to an oxidant comprising one or more of oxygen, ozone, water, nitric acid, oxygen plasma or peroxide to decrease nitrogen content in the plasma treated silicon oxide film to form a low nitrogen content silicon oxide film.

Further embodiments of the disclosure are directed to processing methods comprising placing a substrate having a substrate surface into a processing chamber comprising a plurality of sections. Each section is separated from adjacent sections by a gas curtain. At least a portion of the substrate surface is exposed to a first process condition in a first section of the processing chamber. The first process condition comprises a silicon precursor to form a silicon-containing film. The substrate surface is laterally moved through a gas curtain to a second section of the processing chamber. The silicon-containing film is exposed to a second process condition in a second section of the processing chamber. The second process condition comprising a reactant to form a silicon oxide film. The substrate surface is laterally moved with the silicon oxide film through a gas curtain to a third section of the processing chamber. The silicon oxide film is exposed to a plasma to form a plasma treated silicon oxide film. The substrate surface is moved with the plasma treated silicon oxide film through a gas curtain to a fourth section of the processing chamber. The plasma treated silicon oxide film is exposed to an oxidant to form a low nitrogen silicon oxide film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
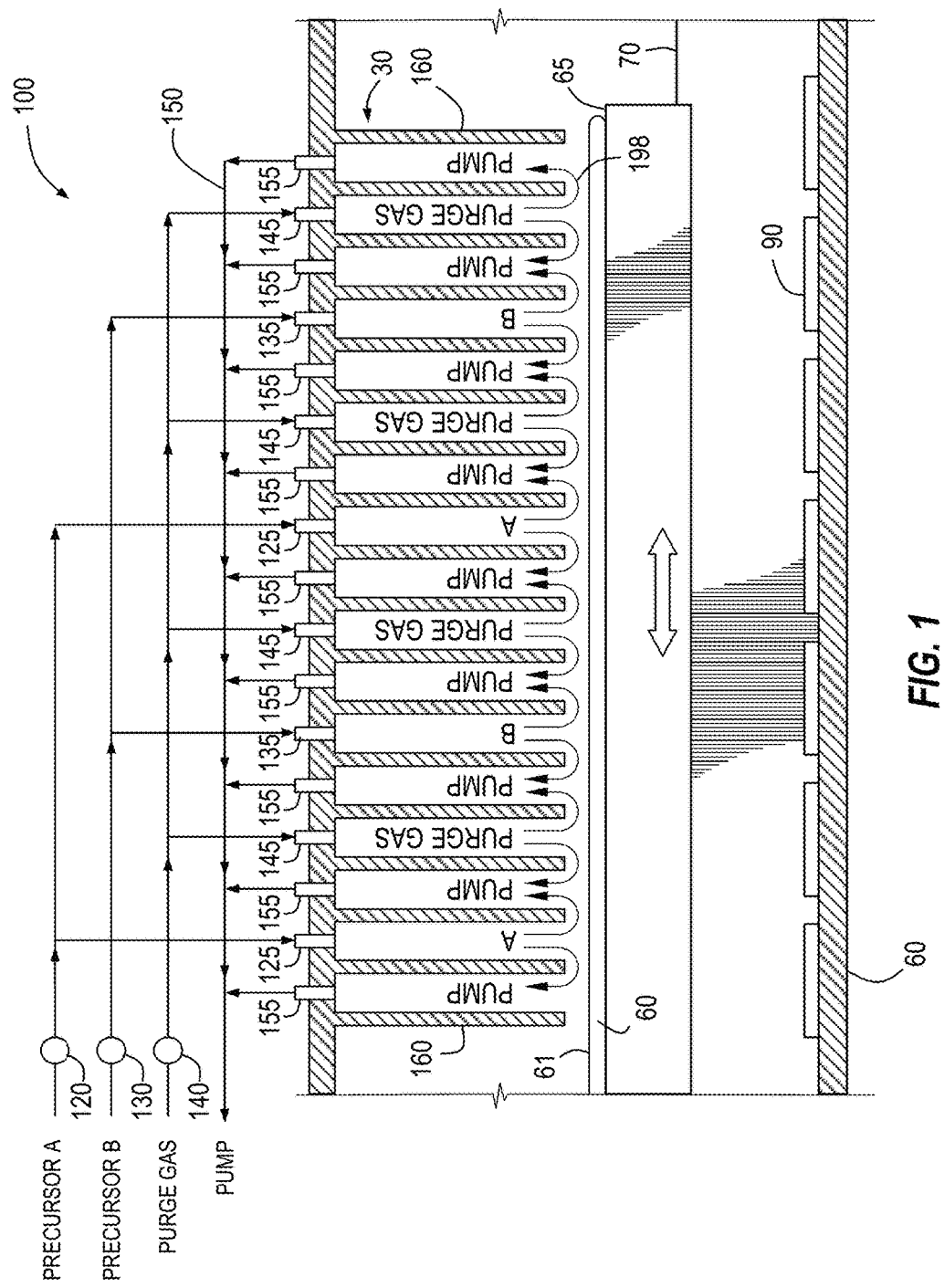
FIG. 1 is a cross-sectional side view of a spatial atomic layer deposition chamber in accordance with one or more embodiment of the disclosure.

Some embodiments of the disclosure provide methods of depositing a silicon dioxide films by atomic layer deposition (ALD) in the temperature range of about 300° C. to about 400° C. Atomic layer deposition can be performed using a traditional time-domain process or a spatial process. A time-domain process exposes the substrate to a first process gas, purging the process chamber of unreacted first process gas and exposing the substrate to a second process gas. Hence, only one process gas is in the processing chamber at any given time. A spatial ALD process, described further below, provides the process gases to separate parts of a process chamber, maintaining separation of the gases and moves the substrate through the different parts of the process chamber.

The ALD silicon oxide film of some embodiments is densified with a plasma treatment and the film is reoxidized with an oxygen source. Embodiments of the disclosure provide a high density silicon dioxide film with a low wet etch rate (WER) and low leakage at low temperatures.

In some embodiments, a nitrogen plasma treatment is used. Without being bound by any particular theory of operation, it is believed that the nitrogen ions are able to densify the film and that radicals are able to remove hydrogen from the film through various radical based mechanisms yielding high quality silicon dioxide with low WER. In some embodiments where the film being created is not SiN, the removal of Si—N bonds formed removal of the hydrogen from the film is performed.

As used in this specification and the appended claims, the terms "reactive gas", "precursor", "reactant", and the like, are used interchangeably to mean a gas that includes a species which is reactive in an atomic layer deposition process. For example, a first "reactive gas" may simply adsorb onto the surface of a substrate and be available for further chemical reaction with a second reactive gas.

Embodiments of the disclosure are directed to methods of depositing high quality $SiO_2$ by ALD at temperatures of 100° C.-650° C. The deposition of $SiO_2$ can be carried out by any Si containing precursor (BTBAS, BDEAS, 3DMAS, 4DMAS and other silylamines $(RR'N)_4SiH_{(4-x)}$, $Me_3SiR$ (R=any leaving group), and $Si(dmap)_4$.

It is believed that $Me_3SiR$ is stable up to very high temperatures >650 C since trimethylsilyl groups on a silicon surface are known to be very stable. Si(dmap)4 should also be very stable since this molecule contains two of the dmap ligands ligated to the silicon atom in an eta-2 fashion. It is well know that chelating ligands are able to add thermal stability to molecules.

The oxygen source during depositions may be $O_2$, $O_3$, $H_2O$, $HNO_3$, $O_2$ Plasma, and $H_2O_2$. The plasma source used can be ($H_2$ Plasma, $N_2$ Plasma, Ar plasma, $N_2O$ plasma, or mixtures thereof).

Typical deposition experiments follow equation 1, where z is the number of cycles corresponding to the Si precursor+ oxygen source cycles and n is the total number of cycles with the plasma treatment. It is believed that the additional oxygen source pulse re-oxidizes any Si—X bonds that may have formed during the plasma treatment (e.g., if $N_2$ plasma is used than SiN bonds will form). Each pulse is separated by an inert purge or chamber pump or both.

$$[(Si\ precursor+oxygen\ source)z+plasma\ treatment+ (oxygen\ source)y]n \qquad \text{Equation 1.}$$

Alternatively, reactions can follow Equation 2. This process is the same as that of Equation 1 except that the oxidant used to react with the silicon precursor can be a different compound than the oxidant.

$$[(Si\ precursor+reactant)z+plasma\ treatment+(oxidant) y]n \qquad \text{Equation 2.}$$

Accordingly, one more embodiments of the disclosure are directed to processing methods comprising depositing a silicon oxide film on a substrate surface. In some embodiments, the silicon oxide film is deposited by atomic layer deposition. In one or more embodiments, the silicon oxide film is deposited by sequential exposure of the substrate surface a silicon precursor followed by a reactant comprising one or more of ozone, oxygen, water, nitric acid, oxygen plasma or peroxide. This is the combined (Si precursor+ reactant) of Equation 2.

The deposition of the silicon oxide film can occur at any suitable temperature at which the silicon precursor and reactant are stable. In some embodiments, the silicon oxide film is deposited at a temperature less than or equal to about 550° C., or less than or equal to about 500° C., or less than or equal to about 450° C., or less than or equal to about 400° C., or less than or equal to about 350° C., or less than or equal to about 300° C., or less than or equal to about 250° C., or less than or equal to about 200° C., or less than or equal to about 150° C. In some embodiments, the silicon oxide film is deposited at a temperature in the range of about 100° C. to about 400° C.

The silicon oxide film is then exposed to a plasma to form a plasma treated silicon oxide film. The plasma treated silicon oxide film of some embodiments is denser than the silicon oxide film. The plasma of some embodiments comprises one or more of hydrogen, nitrogen, argon or $N_2O$. The plasma can be either a direct plasma or a remote plasma.

In some embodiments, the silicon oxide film has a hydrogen content. The hydrogen content is decreased with exposure to the plasma. In some embodiments, the plasma treated silicon oxide film has substantially no hydrogen. As used in this specification and the appended claims, the term "substantially no hydrogen" used in this regard means that hydrogen is present in the film at a concentration less than about 2 atomic percent, or less than about 1 atomic percent or less than about 0.5 atomic percent or less than about 0.1 atomic percent.

After plasma treating the silicon oxide film, atoms of the plasma species may be in the film. For example, a nitrogen plasma may leave nitrogen in the film. The plasma treated silicon oxide film is exposed to an oxidant to decrease the nitrogen content in the film. This forms a low nitrogen content silicon oxide film.

The oxidant used can be the same as the reactant in the ALD deposition of the silicon oxide film or different. In some embodiments the reactant and oxidant are independently selected from the group consisting of ozone, oxygen, water, nitric acid, oxygen plasma, peroxide or combinations thereof.

In some embodiments, the low nitrogen content silicon oxide film has a nitrogen content of less than or equal to about 4 atomic percent, or 3.5 atomic percent, or 3 atomic percent or 2.5 atomic percent or 2 atomic percent. The low nitrogen content silicon oxide film of some embodiments has a wet etch rate ratio less than about 4, or 3.5, or 3, or 2.5, or 2, or 1.5, or 1.4, or 1.3. The low nitrogen content silicon oxide film of some embodiments is grown at a rate greater than about 0.5 Å/cycle, or about 0.6 Å/cycle, or about 0.7 Å/cycle, or about 0.8 Å/cycle, or about 0.9 Å/cycle or about 1.0 Å/cycle or about 1.1 Å/cycle.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. For example, in spatially separated ALD, described with respect to FIG. 1, each precursor is delivered to the substrate, but any individual precursor stream, at any given time, is only delivered to a portion of the substrate. Additionally, reference to depositing on a substrate can mean both a bare substrate and a substrate with one or more films or features deposited or formed thereon.

FIG. 1 is a schematic cross-sectional view of a portion of a processing chamber 20 in accordance with one or more embodiments of the disclosure. The processing chamber 20 is generally a sealable enclosure, which is operated under vacuum, or at least low pressure conditions. The chamber 100 includes a gas distribution assembly 30 capable of distributing one or more gases across the top surface 61 of a substrate 60. The gas distribution assembly 30 can be any suitable assembly known to those skilled in the art, and specific gas distribution assemblies described should not be taken as limiting the scope of the disclosure. The output face of the gas distribution assembly 30 faces the first surface 61 of the substrate 60.

Substrates for use with the embodiments of the disclosure can be any suitable substrate. In some embodiments, the substrate is a rigid, discrete, generally planar substrate. As used in this specification and the appended claims, the term "discrete" when referring to a substrate means that the substrate has a fixed dimension. The substrate of one or more embodiments is a semiconductor substrate, such as a 200 mm or 300 mm diameter silicon substrate. In some embodiments, the substrate is one or more of silicon, silicon germanium, gallium arsenide, gallium nitride, germanium, gallium phosphide, indium phosphide, sapphire and silicon carbide.

The gas distribution assembly 30 comprises a plurality of gas ports to transmit one or more gas streams to the substrate 60 and a plurality of vacuum ports disposed between each gas port to transmit the gas streams out of the processing chamber 20. In the embodiment of FIG. 1, the gas distribution assembly 30 comprises a first precursor injector 120, a second precursor injector 130 and a purge gas injector 140. The injectors 120, 130, 140 may be controlled by a system computer (not shown), such as a mainframe, or by a chamber-specific controller, such as a programmable logic controller. The precursor injector 120 injects a continuous (or pulse) stream of a reactive precursor of compound A into the processing chamber 20 through a plurality of gas ports 125. The precursor injector 130 injects a continuous (or pulse) stream of a reactive precursor of compound B into the processing chamber 20 through a plurality of gas ports 135. The purge gas injector 140 injects a continuous (or pulse) stream of a non-reactive or purge gas into the processing chamber 20 through a plurality of gas ports 145. The purge gas removes reactive material and reactive by-products from the processing chamber 20. The purge gas is typically an inert gas, such as, nitrogen, argon and helium. Gas ports 145 are disposed in between gas ports 125 and gas ports 135 so as to separate the precursor of compound A from the precursor of compound B, avoiding cross-contamination between the precursors.

In another aspect, a remote plasma source (not shown) may be connected to the precursor injector 120 and the precursor injector 130 prior to injecting the precursors into the processing chamber 20. The plasma of reactive species may be generated by applying an electric field to a compound within the remote plasma source. Any power source that is capable of activating the intended compounds may be used. For example, power sources using DC, radio frequency (RF), and microwave (MW) based discharge techniques may be used. If an RF power source is used, it can be either capacitively or inductively coupled. The activation may also be generated by a thermally based technique, a gas breakdown technique, a high energy light source (e.g., UV energy), or exposure to an x-ray source. Exemplary remote plasma sources are available from vendors such as MKS Instruments, Inc. and Advanced Energy Industries, Inc.

The chamber 100 further includes a pumping system 150 connected to the processing chamber 20. The pumping system 150 is generally configured to evacuate the gas streams out of the processing chamber 20 through one or more vacuum ports 155. The vacuum ports 155 are disposed between each gas port so as to evacuate the gas streams out of the processing chamber 20 after the gas streams react with the substrate surface and to further limit cross-contamination between the precursors.

The chamber 100 includes a plurality of partitions 160 disposed on the processing chamber 20 between each port. A lower portion of each partition extends close to the first surface 61 of substrate 60, for example, about 0.5 mm or greater from the first surface 61. In this manner, the lower portions of the partitions 160 are separated from the substrate surface by a distance sufficient to allow the gas streams to flow around the lower portions toward the vacuum ports 155 after the gas streams react with the substrate surface. Arrows 198 indicate the direction of the gas streams. Since the partitions 160 operate as a physical barrier to the gas streams, they also limit cross-contamination between the precursors. The arrangement shown is merely illustrative and should not be taken as limiting the scope of the disclosure. It will be understood by those skilled in the art that the gas distribution system shown is merely one possible distribution system and the other types of showerheads and gas distribution assemblies may be employed.

Figure 3:
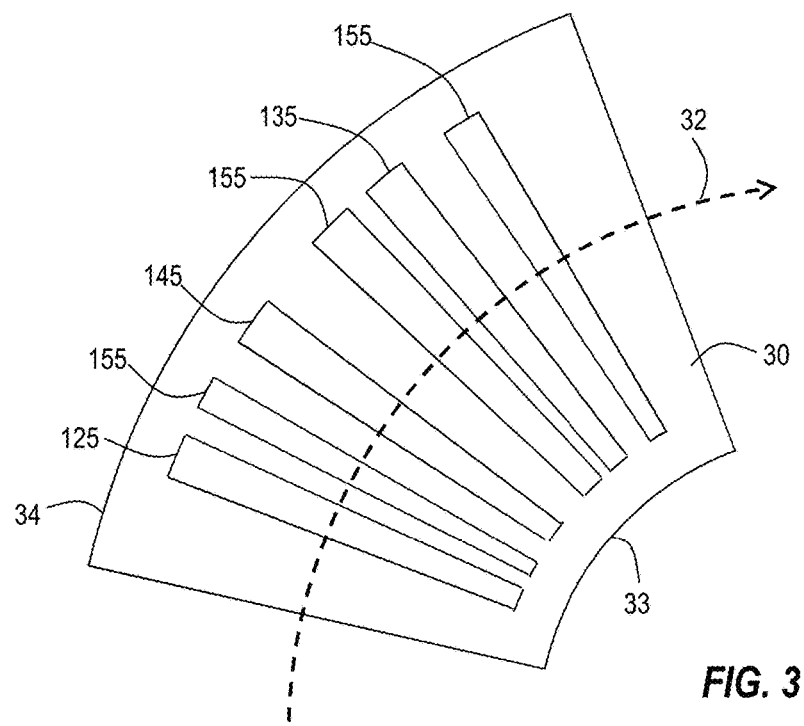
FIG. 3 shows a schematic of a pie-shaped gas distribution assembly in accordance with one or more embodiments of the disclosure.

Atomic layer deposition systems of this sort (i.e., where multiple gases are separately flowed toward the substrate at the same time) are referred to as spatial ALD. In operation, a substrate 60 is delivered (e.g., by a robot) to the processing chamber 20 and can be placed on a shuttle 65 before or after entry into the processing chamber. The shuttle 65 is moved along the track 70, or some other suitable movement mechanism, through the processing chamber 20, passing beneath (or above) the gas distribution assembly 30. In the embodiment shown in FIG. 1, the shuttle 65 is moved in a linear path through the chamber. FIG. 3, as explained further below, shows an embodiment in which wafers are moved in a circular path through a carousel processing system.

Referring back to FIG. 1, as the substrate 60 moves through the processing chamber 20, the first surface 61 of substrate 60 is repeatedly exposed to the reactive gas A coming from gas ports 125 and reactive gas B coming from gas ports 135, with the purge gas coming from gas ports 145 in between. Injection of the purge gas is designed to remove unreacted material from the previous precursor prior to exposing the substrate surface 110 to the next precursor. After each exposure to the various gas streams (e.g., the reactive gases or the purge gas), the gas streams are evacuated through the vacuum ports 155 by the pumping system 150. Since a vacuum port may be disposed on both sides of each gas port, the gas streams are evacuated through the vacuum ports 155 on both sides. Thus, the gas streams flow from the respective gas ports vertically downward toward the first surface 61 of the substrate 60, across the substrate surface 110 and around the lower portions of the partitions 160, and finally upward toward the vacuum ports 155. In this manner, each gas may be uniformly distributed across the substrate surface 110. Arrows 198 indicate the direction of the gas flow. Substrate 60 may also be rotated while being exposed to the various gas streams. Rotation of the substrate may be useful in preventing the formation of strips in the formed layers. Rotation of the substrate can be continuous or in discrete steps and can occur while the substrate is passing beneath the gas distribution assembly 30 or when the substrate is in a region before and/or after the gas distribution assembly 30.

Sufficient space is generally provided after the gas distribution assembly 30 to ensure complete exposure to the last gas port. Once the substrate 60 has completely passed beneath the gas distribution assembly 30, the first surface 61 has completely been exposed to every gas port in the processing chamber 20. The substrate can then be transported back in the opposite direction or forward. If the substrate 60 moves in the opposite direction, the substrate surface may be exposed again to the reactive gas A, the purge gas, and reactive gas B, in reverse order from the first exposure.

The extent to which the substrate surface 110 is exposed to each gas may be determined by, for example, the flow rates of each gas coming out of the gas port and the rate of movement of the substrate 60. In one embodiment, the flow rates of each gas are controlled so as not to remove adsorbed precursors from the substrate surface 61. The width between each partition, the number of gas ports disposed on the processing chamber 20, and the number of times the substrate is passed across the gas distribution assembly may also determine the extent to which the substrate surface 61 is exposed to the various gases. Consequently, the quantity and quality of a deposited film may be optimized by varying the above-referenced factors.

Although description of the process has been made with the gas distribution assembly 30 directing a flow of gas downward toward a substrate positioned below the gas distribution assembly, it will be understood that this orientation can be different. In some embodiments, the gas distribution assembly 30 directs a flow of gas upward toward a substrate surface. As used in this specification and the appended claims, the term "passed across" means that the substrate has been moved from one side of the gas distribution assembly to the other side so that the entire surface of the substrate is exposed to each gas stream from the gas distribution plate. Absent additional description, the term "passed across" does not imply any particular orientation of gas distribution assemblies, gas flows or substrate positions.

In some embodiments, the shuttle 65 is a susceptor 66 for carrying the substrate 60. Generally, the susceptor 66 is a carrier which helps to form a uniform temperature across the substrate. The susceptor 66 is movable in both directions (left-to-right and right-to-left, relative to the arrangement of FIG. 1) or in a circular direction (relative to FIG. 3). The susceptor 66 has a top surface 67 for carrying the substrate 60. The susceptor 66 may be a heated susceptor so that the substrate 60 may be heated for processing. As an example, the susceptor 66 may be heated by radiant heat lamps 90, a heating plate, resistive coils, or other heating devices, disposed underneath the susceptor 66.

Figure 2:
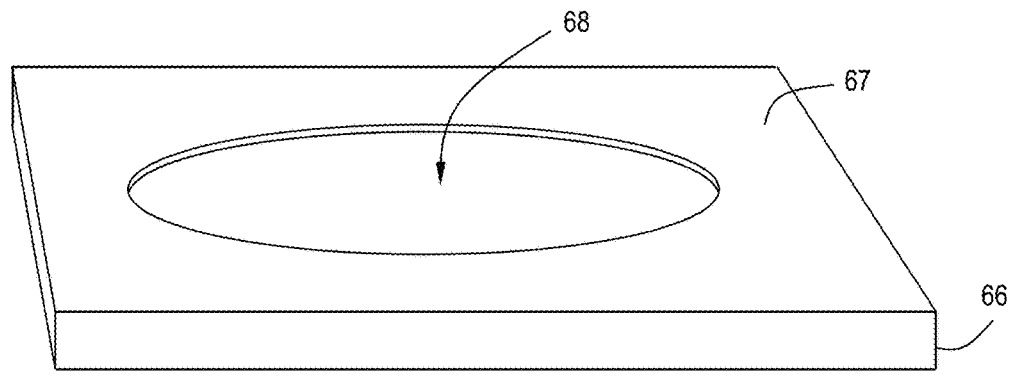
FIG. 2 shows a perspective view of a susceptor in accordance with one or more embodiments of the disclosure.

In still another embodiment, the top surface 67 of the susceptor 66 includes a recess 68 to accept the substrate 60, as shown in FIG. 2. The susceptor 66 is generally thicker than the thickness of the substrate so that there is susceptor material beneath the substrate. In some embodiments, the recess 68 is sized such that when the substrate 60 is disposed inside the recess 68, the first surface 61 of substrate 60 is level with, or substantially coplanar with, the top surface 67 of the susceptor 66. Stated differently, the recess 68 of some embodiments is sized such that when a substrate 60 is disposed therein, the first surface 61 of the substrate 60 does not protrude above the top surface 67 of the susceptor 66. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

FIG. 1 shows a cross-sectional view of a processing chamber in which the individual gas ports are shown. This embodiment can be either a linear processing system in which the width of the individual gas ports is substantially the same across the entire width of the gas distribution plate, or a pie-shaped segment in which the individual gas ports change width to conform to the pie shape. FIG. 3 shows a portion of a pie-shaped gas distribution assembly 30. A substrate would be passed across this gas distribution assembly 30 in an arc shape path 32. Each of the individual gas ports 125, 135, 145, 155 have a narrower width near the inner peripheral edge 33 of the gas distribution assembly 30 a and a larger width near the outer peripheral edge 34 of the gas distribution assembly 30. The shape or aspect ratio of the individual ports can be proportional to, or different from, the shape or aspect ratio of the gas distribution assembly 30 segment. In some embodiments, the individual ports are shaped so that each point of a wafer passing across the gas distribution assembly 30 following path 32 would have about the same residence time under each gas port. The path of the substrates can be perpendicular to the gas ports. In some embodiments, each of the gas distribution assemblies comprise a plurality of elongate gas ports which extend in a direction substantially perpendicular to the path traversed by a substrate. As used in this specification and the appended claims, the term "substantially perpendicular" means that the general direction of movement is approximately perpendicular to the axis of the gas ports. For a pie-shaped gas port, the axis of the gas port can be considered to be a line defined as the mid-point of the width of the port extending along the length of the port. As described further below, each of the individual pie-shaped segments can be configured to deliver a single reactive gas or multiple reactive gases separated spatially or in combination (e.g., as in a typical CVD process).

Figure 4:
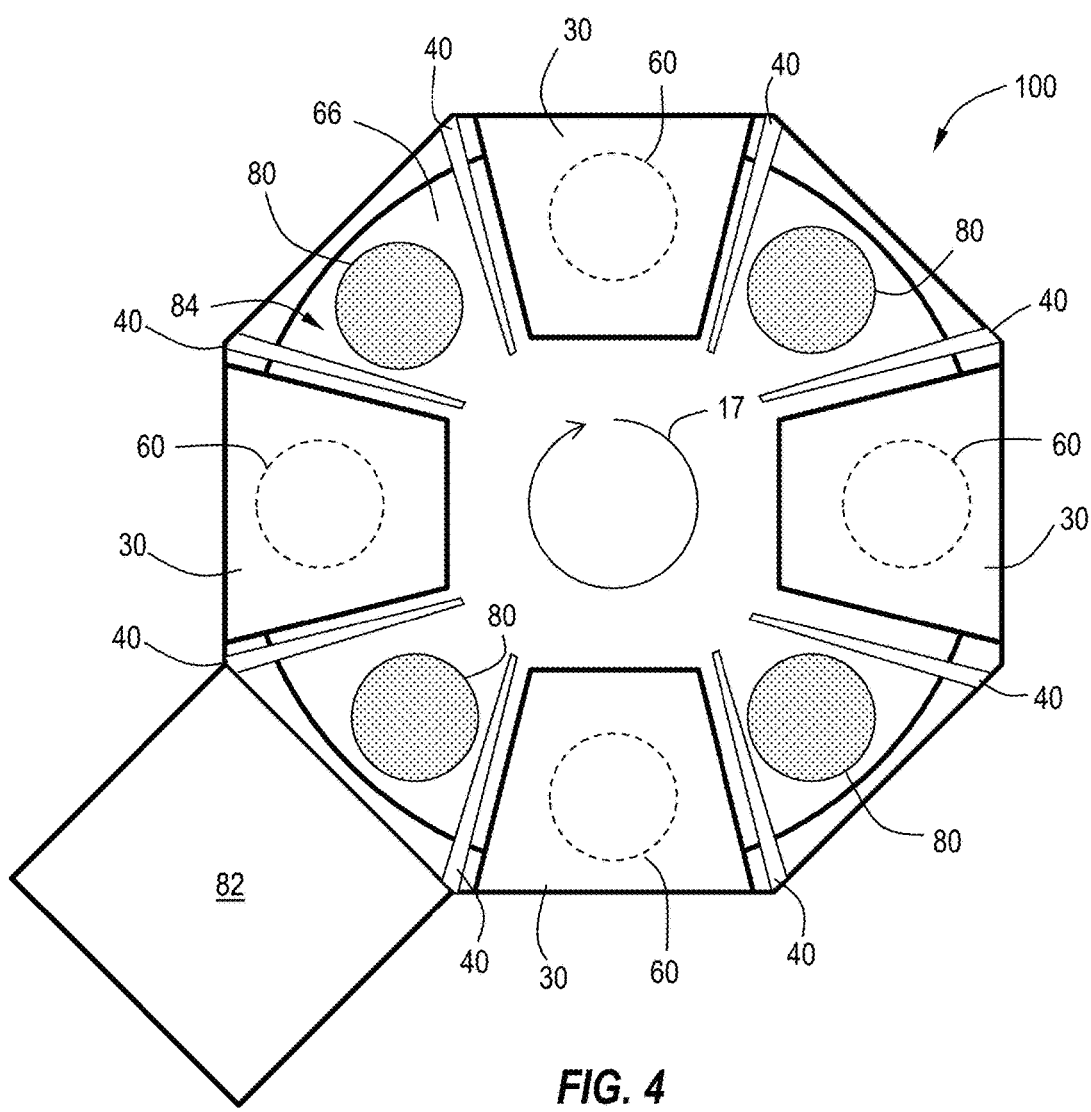
FIG. 4 is a schematic plan view of a substrate processing system configured with four gas distribution assembly units with a loading station in accordance with one or more embodiments of the disclosure.

Processing chambers having multiple gas injectors can be used to process multiple wafers simultaneously so that the wafers experience the same process flow. For example, as shown in FIG. 4, the processing chamber 100 has four gas distribution assemblies 30 and four substrates 60. At the outset of processing, the substrates 60 can be positioned between the distribution assemblies 30. Rotating the susceptor 66 of the carousel by 45° will result in each substrate 60 being moved to an injector assembly 30 for film deposition. This is the position shown in FIG. 4. An additional 45° rotation would move the substrates 60 away from the distribution assemblies 30. With spatial ALD injectors, a film is deposited on the wafer during movement of the wafer relative to the injector assembly. In some embodiments, the susceptor 66 is rotated so that the substrates 60 do not stop beneath the distribution assemblies 30. The number of substrates 60 and gas distribution assemblies 30 can be the same or different. In some embodiments, there is the same number of wafers being processed as there are gas distribution assemblies. In one or more embodiments, the number of wafers being processed are an integer multiple of the number of gas distribution assemblies. For example, if there are four gas distribution assemblies, there are 4x wafers being processed, where x is an integer value greater than or equal to one.

The processing chamber 100 shown in FIG. 4 is merely representative of one possible configuration and should not be taken as limiting the scope of the disclosure. Here, the processing chamber 100 includes a plurality of gas distribution assemblies 30. In the embodiment shown, there are four gas distribution assemblies 30 evenly spaced about the processing chamber 100. The processing chamber 100 shown is octagonal, however, it will be understood by those skilled in the art that this is one possible shape and should not be taken as limiting the scope of the disclosure. The gas distribution assemblies 30 shown are rectangular, but it will be understood by those skilled in the art that the gas distribution assemblies can be pie-shaped segments, like that shown in FIG. 3. Additionally, each segment can be configured to deliver gases in a spatial type arrangement with multiple different reactive gases flowing from the same segment or configured to deliver a single reactive gas or a mixture of reactive gases.

The processing chamber 100 includes a substrate support apparatus, shown as a round susceptor 66 or susceptor assembly. The substrate support apparatus, or susceptor 66, is capable of moving a plurality of substrates 60 beneath each of the gas distribution assemblies 30. A load lock 82 might be connected to a side of the processing chamber 100 to allow the substrates 60 to be loaded/unloaded from the chamber 100.

The processing chamber 100 may include a plurality, or set, of first treatment stations 80 positioned between any or each of the plurality of gas distribution assemblies 30. In some embodiments, each of the first treatment stations 80 provides the same treatment to a substrate 60.

The number of treatment stations and the number of different types of treatment stations can vary depending on the process. For example, there can be one, two, three, four, five, six, seven or more treatment stations positioned between the gas distribution assemblies 30. Each treatment stations can independently provide a different treatment from every other set of treatments station, or there can be a mixture of the same type and different types of treatments. In some embodiments, one or more of the individual treatments stations provides a different treatment than one or more of the other individual treatment stations. The embodiment shown in FIG. 4 shows four gas distribution assemblies with spaces between which can include some type of treatment station. However, it can be easily envisioned from this drawing that the processing chamber can readily be incorporated with eight gas distribution assemblies with the gas curtains between.

Figure 5:
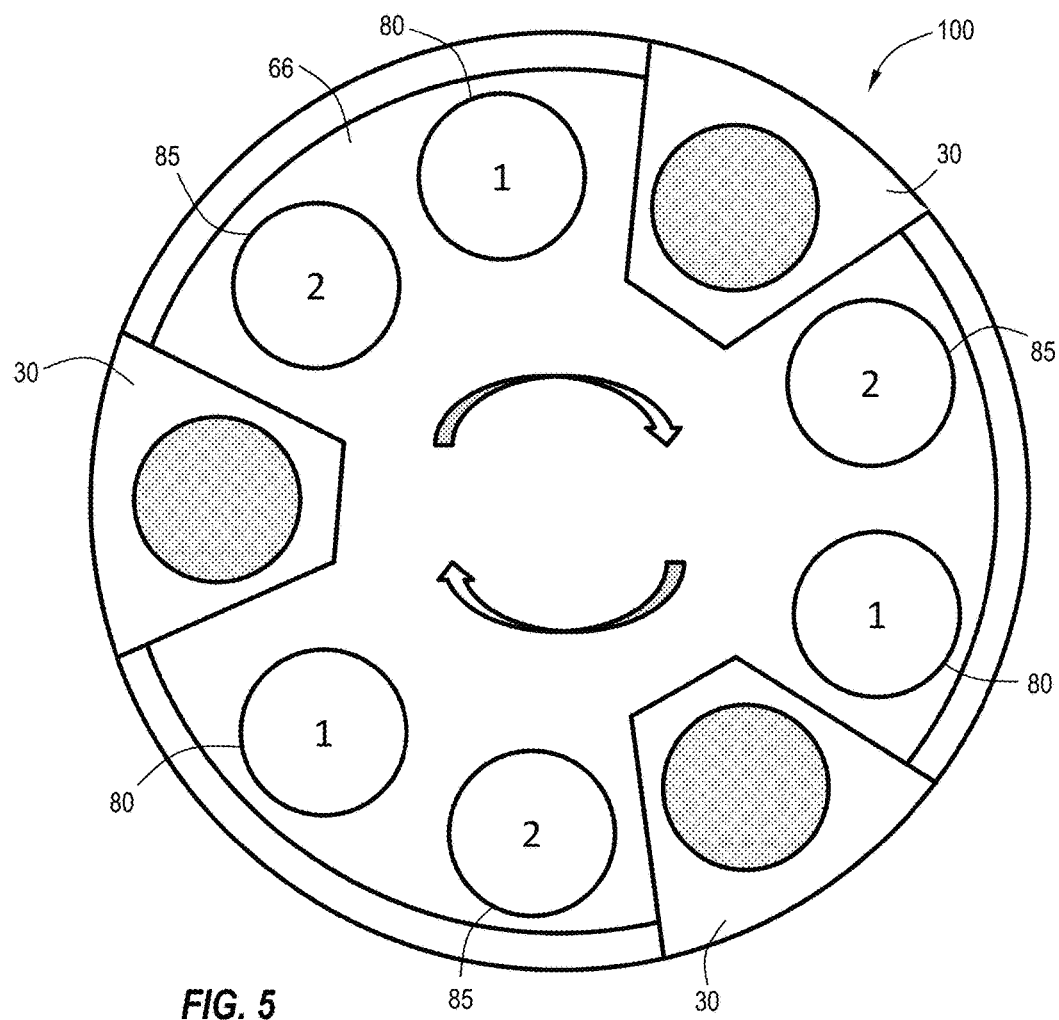
FIG. 5 is a schematic plan view of a substrate processing system configured with three gas distribution assembly units.

In the embodiment shown in FIG. 5, a set of second treatment stations 85 are positioned between the first treatment stations 80 and the gas distribution assemblies 30 so that a substrate 60 rotated through the processing chamber 100 would encounter, depending on where the substrate 60 starts, a gas distribution assembly 30, a first treatment station 80 and a second treatment station 85 before encountering a second of any of these. For example, as shown in FIG. 5, if the substrate started at the first treatment station 80, it would see, in order, the first treatment station 80, a gas distribution assembly 30 and a second treatment station 85 before encountering a second first treatment station 85.

Treatment stations can provide any suitable type of treatment to the substrate, film on the substrate or susceptor assembly. For example, UV lamps, flash lamps, plasma sources and heaters. The wafers are then moved between positions with the gas distribution assemblies 30 to a position with, for example, a showerhead delivering plasma to the wafer. The plasma station being referred to as a treatment station 80. In one or more example, silicon nitride films can be formed with plasma treatment after each deposition layer. As the ALD reaction is, theoretically, self-limiting as long as the surface is saturated, additional exposure to the deposition gas will not cause damage to the film.

Rotation of the carousel can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where it can pause again. Pausing between the injectors may provide time for additional processing steps between each layer deposition (e.g., exposure to plasma).

In some embodiments, the processing chamber comprises a plurality of gas curtains 40. Each gas curtain 40 creates a barrier to prevent, or minimize, the movement of processing gases from the gas distribution assemblies 30 from migrating from the gas distribution assembly regions and gases from the treatment stations 80 from migrating from the treatment station regions. The gas curtain 40 can include any suitable combination of gas and vacuum streams which can isolate the individual processing sections from the adjacent sections. In some embodiments, the gas curtain 40 is a purge (or inert) gas stream. In one or more embodiments, the gas curtain 40 is a vacuum stream that removes gases from the processing chamber. In some embodiments, the gas curtain 40 is a combination of purge gas and vacuum streams so that there are, in order, a purge gas stream, a vacuum stream and a purge gas stream. In one or more embodiments, the gas curtain 40 is a combination of vacuum streams and purge gas streams so that there are, in order, a vacuum stream, a purge gas stream and a vacuum stream. The gas curtains 40 shown in FIG. 4 are positioned between each of the gas distribution assemblies 30 and treatment stations 80, but it will be understood that the curtains can be positioned at any point or points along the processing path.

Figure 6:
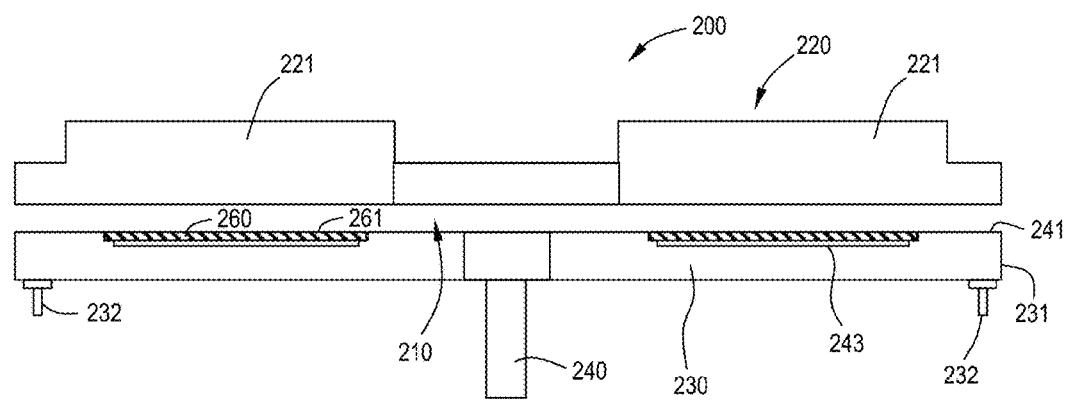
FIG. 6 shows a cross-sectional view of a processing chamber in accordance with one or more embodiments of the disclosure.

FIG. 6 shows an embodiment of a processing chamber 200 including a gas distribution assembly 220, also referred to as the injectors, and a susceptor assembly 230. In this embodiment, the susceptor assembly 230 is a rigid body. The rigid body of some embodiments has a droop tolerance no larger than 0.05 mm. Actuators 232 are placed, for example, at three locations at the outer diameter region of the susceptor assembly 230. As used in this specification and the appended claims, the terms "outer diameter" and "inner diameter" refer to regions near the outer peripheral edge and the inner edge, respectively. The outer diameter is not to a specific position at the extreme outer edge (e.g., near shaft 240) of the susceptor assembly 230, but is a region near the outer edge 231 of the susceptor assembly 230. This can be seen in FIG. 6 from the placement of the actuators 232. The number of actuators 232 can vary from one to any number that will fit within the physical space available. Some embodiments have two, three, four or five sets of actuators 232 positioned in the outer diameter region 231. As used in this specification and the appended claims, the term "actuator" refers to any single or multi-component mechanism which is capable of moving the susceptor assembly 230, or a portion of the susceptor assembly 230, toward or away from the gas distribution assembly 220. For example, actuators 232 can be used to ensure that the susceptor assembly 230 is substantially parallel to the injector assembly 220. As used in this specification and the appended claims, the term "substantially parallel" used in this regard means that the parallelism of the components does not vary by more than 5% relative to the distance between the components.

Once pressure is applied to the susceptor assembly 230 from the actuators 232, the susceptor assembly 230 can be levelled. As the pressure is applied by the actuators 232, the gap 210 distance can be set to be within the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The susceptor assembly 230 is positioned beneath the gas distribution assembly 220. The susceptor assembly 230 includes a top surface 241 and, optionally, at least one recess 243 in the top surface 241. The recess 243 can be any suitable shape and size depending on the shape and size of the wafers 260 being processed. In the embodiment shown, the recess 243 has a step region around the outer peripheral edge of the recess 241. The steps can be sized to support the outer peripheral edge of the wafer 260. The amount of the outer peripheral edge of the wafer 260 that is supported by the steps can vary depending on, for example, the thickness of the wafer and the presence of features already present on the back side of the wafer.

In some embodiments, as shown in FIG. 6, the recess 243 in the top surface 241 of the susceptor assembly 230 is sized so that a wafer 260 supported in the recess 243 has a top surface 261 substantially coplanar with the top surface 241 of the susceptor assembly 230. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 230 of FIG. 6 includes a support post 240 which is capable of lifting, lowering and rotating the susceptor assembly 230. The susceptor assembly 230 may include a heater, or gas lines, or electrical components within the center of the support post 240. The support post 240 may be the primary means of increasing or decreasing the gap between the susceptor assembly 230 and the gas distribution assembly 220, moving the susceptor assembly 230 into rough position. The actuators 232 can then make micro-adjustments to the position of the susceptor assembly to create the desired gap.

Figure 7:
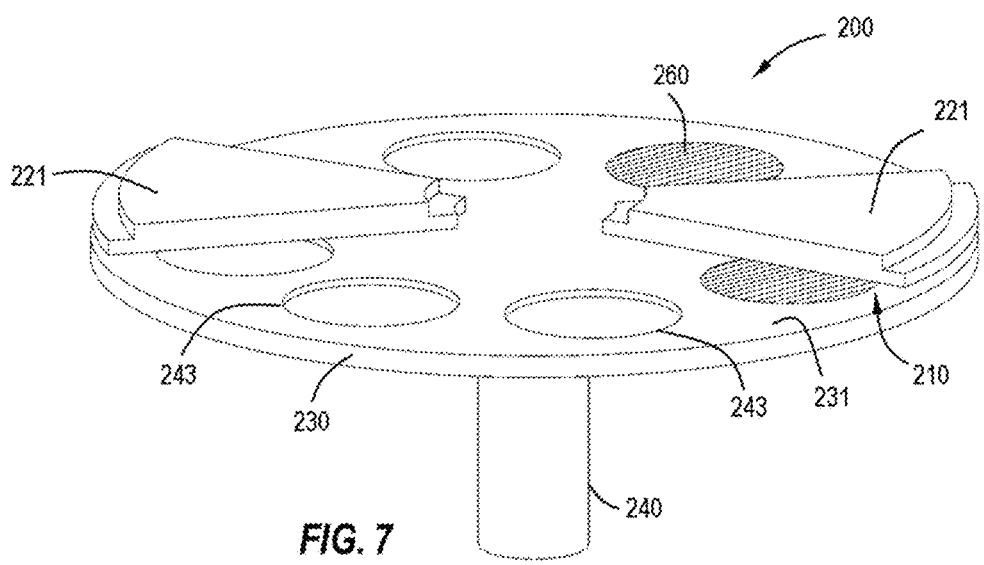
FIG. 7 shows a perspective view of a susceptor assembly and gas distribution assembly units in accordance with one or more embodiments of the disclosure.

The processing chamber 100 shown in FIG. 6 is a carousel-type chamber in which the susceptor assembly 230 can hold a plurality of wafers 260. The gas distribution assembly 220 may include a plurality of separate injector units 221, each injector unit 221 being capable of depositing a film or part of a film on the wafer 260, as the wafer is moved beneath the injector unit 221. FIG. 7 shows a perspective view of a carousel-type processing chamber 200. Two pie-shaped injector units 221 are shown positioned on approximately opposite sides of and above the susceptor assembly 230. This number of injector units 221 is shown for illustrative purposes only. It will be understood that more or less injector units 221 can be included. In some embodiments, there are a sufficient number of pie-shaped injector units 221 to form a shape conforming to the shape of the susceptor assembly 230. In some embodiments, each of the individual pie-shaped injector units 221 may be independently moved, removed and/or replaced without affecting any of the other injector units 221. For example, one segment may be raised to permit a robot to access the region between the susceptor assembly 230 and gas distribution assembly 220 to load/unload wafers 260.

Figure 8:
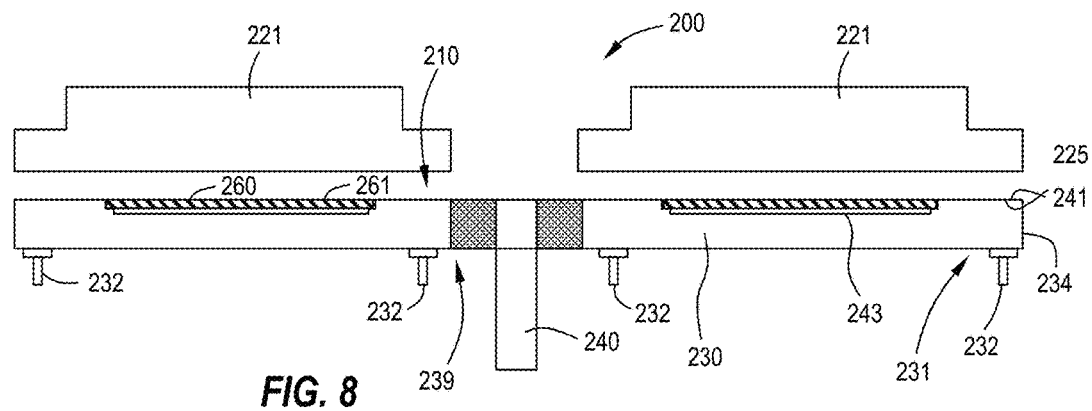
FIG. 8 shows a cross-sectional view of a processing chamber in accordance with one or more embodiments of the disclosure.

FIG. 8 shows another embodiment of the disclosure in which the susceptor assembly 230 is not a rigid body. In some embodiments, the susceptor assembly 230 has a droop tolerance of not more than about 0.1 mm, or not more than about 0.05 mm, or not more than about 0.025 mm, or not more than about 0.01 mm. Here, there are actuators 232 placed at the outer diameter region 231 and at the inner diameter region 239 of the susceptor assembly 230. The actuators 232 can be positioned at any suitable number of places around the inner and outer periphery of the susceptor assembly 230. In some embodiments, the actuators 232 are placed at three locations at both the outer diameter region 231 and the inner diameter region 239. The actuators 232 at both the outer diameter region 231 and the inner diameter region 239 apply pressure to the susceptor assembly 230.

Figure 9:
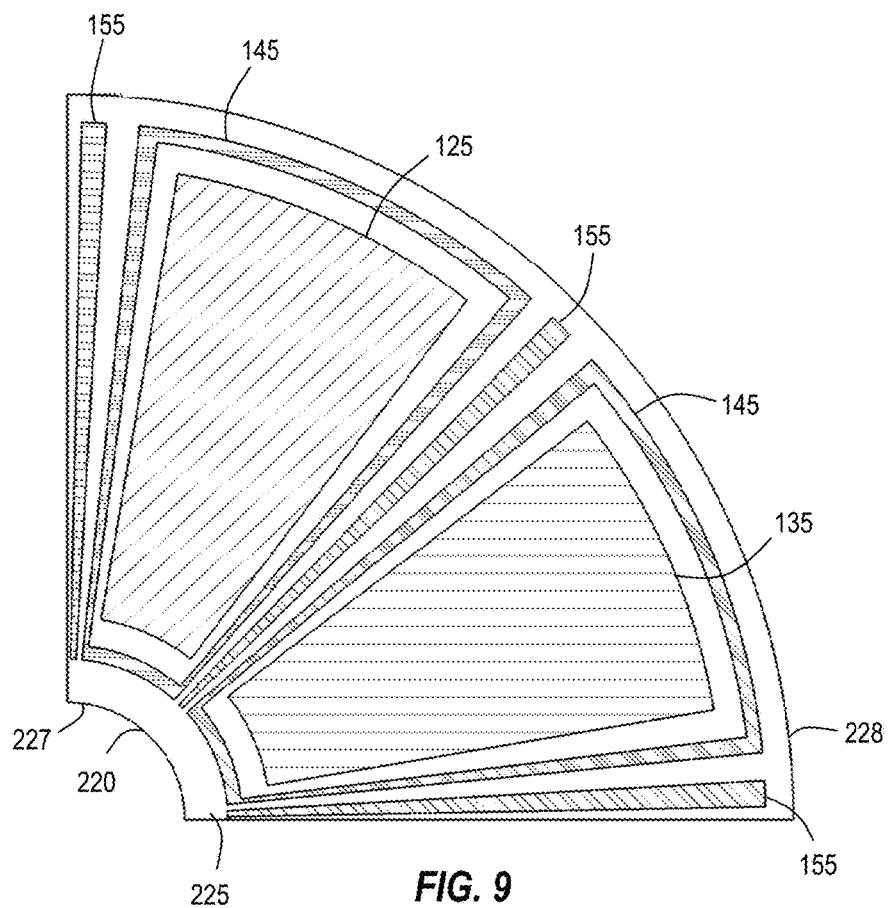
FIG. 9 shows a schematic of a pie-shaped gas distribution assembly in accordance with one or more embodiments of the disclosure.
Figure 10:
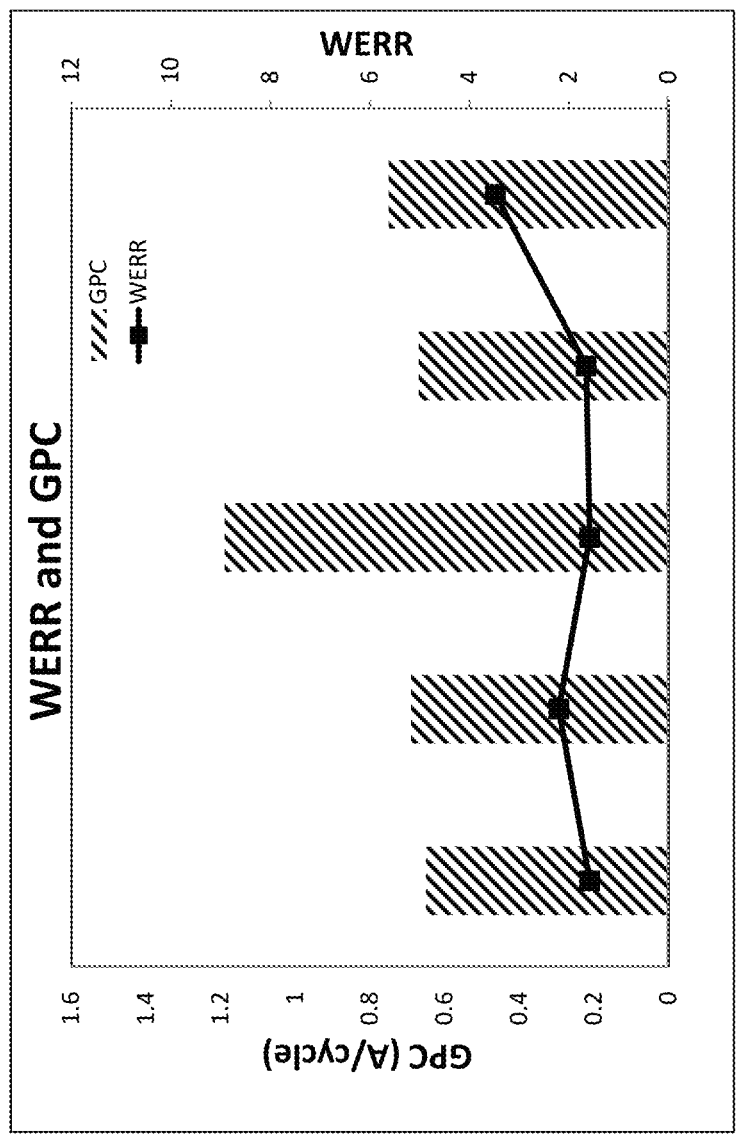
FIG. 10 shows a graph of the growth per cycle and wet etch rate ratios for the samples discussed in the Examples.

FIG. 9 shows an embodiment of a processing chamber comprising a circular gas distribution assembly with a diverter and a susceptor assembly. The circular gas distribution assembly 220, a portion of which can be seen in FIG. 9 is positioned within the processing chamber and comprises a plurality of elongate gas ports 125, 135, 145 in a front face 225 of the gas distribution assembly 220. The plurality of elongate gas ports 125, 135, 145 extend from an area adjacent the inner peripheral edge 227 toward an area adjacent the outer peripheral edge 228 of the gas distribution assembly 220. The plurality of gas ports shown in FIG. 9 include a first reactive gas port 125, a second reactive gas port 135, a purge gas port 145 which surrounds each of the first reactive gas ports and the second reactive gas ports and vacuum ports 155.

A susceptor assembly 230 is positioned within the processing chamber to rotate at least one substrate in a substantially circular path about a rotational axis. As used in this specification and the appended claims, the term "substantially circular" means that the path is intended to be circular if the substrate were to complete a full rotation. The susceptor assembly has a top surface 241 (as shown in FIG. 8) defined by an inner peripheral edge 229 and an outer peripheral edge 231. The susceptor assembly 230 is positioned below the gas distribution assembly 220 so that the top surface 241 of the susceptor assembly 230 faces the front face 225 of the gas distribution assembly 220.

Some embodiments of the disclosure are directed to methods of processing a substrate. A substrate is placed into a processing chamber which has a plurality of sections, with each section separated from adjacent sections by a gas curtain. As used in this specification and the appended claims, the terms "section", "region" and "sector" are used interchangeably to describe an area within a batch processing chamber. Upon entering the processing chamber, the substrate (also called a wafer) can be in any of the individual sections. Each section can have the same or different processing conditions from the adjacent sections. As used in this specification and the appended claims, the term "processing condition," and the like, means the entirety of the conditions within the individual section. For example, processing conditions include, but are not limited to, gas composition, pressure, flow rate, temperature and plasma. Processing conditions can be configured to, for example, deposition, etching and treatment (e.g., densification, annealing).

In the first section, the substrate, or a portion of the substrate, is exposed to a first process condition to deposit a first film on the surface of the substrate. The substrate surface can be a bare substrate surface or any layer previously deposited on the surface. The individual surface composition can vary and should not be taken as limiting the scope of the disclosure. In some embodiments, the first process conditions in the first section comprise a silicon-containing precursor. The silicon-containing precursor adsorbs (or similar mechanism) to the substrate surface forming a silicon-containing film.

After formation of the silicon-containing film, the substrate is laterally moved through a gas curtain to a second section of the processing chamber. In the second section, the silicon-containing film is exposed to second process conditions to form a second film. The second process conditions comprise a reactant that can react with the silicon-containing film to form a silicon oxide film.

During the movement from the first section to the second section, the substrate is exposed to the first process conditions, the second process conditions and a gas curtain which separates the two. The gas curtain can be, for example, a combination of inert gases and vacuum to ensure that there is minimal, if any, gas phase reaction between the first process conditions and the second process conditions. At some time during the movement, part of the surface is exposed to the first process conditions, another part of the surface is exposed to the second process conditions and an intermediate portion, between the other two portions, of the substrate is exposed to the gas curtain.

The exposure to the first process conditions and the second process conditions can be repeated sequentially to grow a film of predetermined thickness. For example, the batch processing chamber may contain two sections with the first process conditions and two sections of the second process conditions in alternating pattern, so that rotation of the substrate around the central axis of the processing chamber causes the surface to be sequentially and repeatedly exposed to the first and second process conditions so that each exposure causes the film thickness (for depositions) to grow.

The substrate is moved laterally from the second section through a gas curtain to a third section of the processing chamber. The third section has third process conditions comprising a plasma. The silicon oxide film is exposed to the plasma to form a plasma treated silicon oxide film. During transfer, a first portion of the surface is exposed to the second process conditions at the same time that a second portion of the surface is exposed to the third process conditions and an intermediate portion of the substrate is exposed to the gas curtain. As used in this specification and the appended claims, the term "intermediate portion" used in this respect means a portion of the substrate between the first portion with is exposed to one process condition and the second portion which is exposed to a different process condition.

The substrate is laterally moved from the third section through a gas curtain to a fourth section of the processing chamber. The plasma treated silicon oxide film is exposed to fourth process conditions to form a low nitrogen silicon oxide film. The fourth process conditions comprise an oxidant. During movement, a first portion of the surface is exposed to the third process conditions at the same time that a second portion of the surface is exposed to the fourth process conditions and an intermediate portion of the surface is exposed to the gas curtain.

The direction of motion of the substrate can be unidirectional or reciprocal. As used in this context, unidirectional means that the substrate is moved in one direction on the macro scale. For example, the substrate may be rotated clockwise around the processing chamber but have small portions that are counter-clockwise. If the overall direction of motion is clockwise, then the movement is unidirectional. The same would be the case if the motion were counter-clockwise with periodic clockwise rotation. In an embodiment of this sort, the substrate can be laterally moved from the fourth section of the processing chamber to the first section of the processing chamber without exposure to either the second section or the third section. In one or more embodiments, the substrate is moved from the fourth section directly to the first section and the exposure to the first process condition; second process condition; third process condition and fourth process condition are repeated. This can be done any number of times to deposit a film of desired thickness.

In some embodiments, the direction of rotation is reciprocal on the macro scale. This means that the overall motion would be clockwise through all sections and then reversed to be counter-clockwise through all sections of the processing chamber. In one or more embodiments, the motion is a combination of unidirectional and reciprocal. For example, the substrate may be moved in a single direction through the first section of the processing chamber and then moved in a reciprocal motion back and forth in the second section or, for example, between the second and third sections before moving onto the fourth section. Those skilled in the art will understand that there are any numbers of individual rotation/motion patterns available.

EXAMPLES

Example 1

Si precursor was $Me_3Si(pyrrolyl)$ (2 s exposure); oxygen source was $O_3$ (3 s exposure); plasma treatment was a $N_2$ Plasma (100 W) (5 s exposure); referring to Equation 1, z=4, y=0, n=100 cycles; Deposition temperature was 300 C.

Example 2

Si precursor was Me$_3$Si(pyrrolyl) (2 s exposure); oxygen source was O$_3$ (3 s exposure); plasma treatment was a N$_2$ Plasma (100 W) (5 s exposure); referring to Equation 1, z=4, y=0, n=100 cycles; Deposition temperature was 400 C.

Example 3

Si precursor was Me$_3$Si(pyrrolyl) (2 s exposure) oxygen source=Ozone (6 s exposure); plasma treatment was N$_2$ Plasma (100 W) (5 s exposure); referring to Equation 1, y=1 z=1 n=100 cycles Deposition temperature was 300 C.

Example 4

Si precursor was Me$_3$Si(pyrrolyl) (2 s exposure) oxygen source=Ozone (6 s exposure); plasma treatment was N$_2$ Plasma (100 W) (5 s exposure); referring to Equation 1, y=1 z=1 n=100 cycles; Deposition temperature was 400 C.

Example 5

Si precursor was Me$_3$Si(pyrrolyl) (2 s exposure) oxygen source=Ozone (3 s exposure) plasma treatment was a N$_2$ Plasma (100 W) (5 s exposure); referring to Equation 1, y=0 z=1 n=100 cycles; Deposition temperature was 400 C.

The inventors have found that a silicon oxide film can be deposited at low temperatures with compositions that are almost 100% SiO$_2$, and have a WERR as low as 1.5 when combining an ozone process with periodic N$_2$ plasma treatments. Without being bound by any particular theory of operation, it is believed that the improvement in film properties is related to the N$_2$ or N radicals extracting hydrogen out of the film through various radical mechanisms.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be required. Indeed, other embodiments relate to deposition processes under very mild conditions without a plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

While the foregoing is directed to embodiments of the present disclosure, other and further embodiments of the disclosure may be devised without departing from the basic scope thereof, and the scope thereof is determined by the claims that follow.

What is claimed is:

1. A processing method comprising:
    depositing a silicon oxide film on a substrate surface at a temperature of about 300° C. to about 400° C. by sequential exposure of the substrate surface to a silicon precursor followed by a reactant comprising one or more of oxygen, ozone, water, nitric acid, oxygen plasma or peroxide, the silicon oxide film having a hydrogen content;
    exposing the silicon oxide film to a plasma comprising nitrogen to form a plasma treated silicon oxide film with a nitrogen content greater than or equal to 2.5 atomic percent and a lower hydrogen content than the silicon oxide film; and
    exposing the plasma treated silicon oxide film to an oxidant comprising ozone to decrease nitrogen content in the plasma treated silicon oxide film to form a low nitrogen content silicon oxide film with a nitrogen content less than 2.5 atomic percent.

2. A processing method comprising:
    placing a substrate having a substrate surface into a processing chamber comprising a plurality of sections, each section separated from adjacent sections by a gas curtain;
    exposing at least a portion of the substrate surface to a first process condition in a first section of the processing chamber, the first process condition comprising a silicon precursor to form a silicon-containing film;
    laterally moving the substrate surface through a gas curtain to a second section of the processing chamber;
    exposing the silicon-containing film to a second process condition in a second section of the processing chamber, the second process condition comprising a reactant to form a silicon oxide film, the silicon oxide film having a nitrogen content greater than or equal to 2.5 atomic percent;
    laterally moving the substrate surface with the silicon oxide film through a gas curtain to a third section of the processing chamber;
    exposing the silicon oxide film to a plasma to form a plasma treated silicon oxide film;
    laterally moving the substrate surface with the plasma treated silicon oxide film through a gas curtain to a fourth section of the processing chamber; and
    exposing the plasma treated silicon oxide film to an oxidant to lower the nitrogen content to form a low nitrogen silicon oxide film with a nitrogen content less than or equal to 2.5 atomic percent,
    wherein the oxidant does not contain plasma.

3. The processing method of claim 2, wherein the reactant and the oxidant are independently selected from the group consisting of ozone, oxygen, water, nitric acid, oxygen plasma, peroxide or combinations thereof.

4. The processing method of claim 2, wherein the silicon oxide film is deposited at a temperature in the range of about 100° C. to about 400° C.

5. The processing method of claim 2, wherein the plasma comprises one or more of hydrogen, nitrogen, argon or $N_2O$.

6. The processing method of claim 5, wherein the plasma is a remote plasma.

* * * * *